US006596081B1

(12) United States Patent
Arnowitz et al.

(10) Patent No.: US 6,596,081 B1
(45) Date of Patent: *Jul. 22, 2003

(54) DYNAMICALLY CONTROLLED CRYSTALLIZATION METHOD AND APPARATUS AND CRYSTALS OBTAINED THEREBY

(75) Inventors: Leonard Arnowitz, Chevy Chase, MD (US); Emanuel Steinberg, Tel Aviv (IL)

(73) Assignee: BSI Proteomics Corporation

( * ) Notice: Subject to any disclaimer, the term of this patent is extended or adjusted under 35 U.S.C. 154(b) by 0 days.

This patent is subject to a terminal disclaimer.

(21) Appl. No.: 09/622,553

(22) PCT Filed: Feb. 18, 1999

(86) PCT No.: PCT/US99/03515
§ 371 (c)(1),
(2), (4) Date: Dec. 12, 2000

(87) PCT Pub. No.: WO99/42191
PCT Pub. Date: Aug. 26, 1999

Related U.S. Application Data

(63) Continuation of application No. 09/025,475, filed on Feb. 18, 1998, now Pat. No. 5,961,934.

(51) Int. Cl.[7] ................................................. C30B 7/08
(52) U.S. Cl. ......................... 117/201; 117/68; 117/69; 117/901
(58) Field of Search ............................. 117/68, 69, 201, 117/901

(56) References Cited

U.S. PATENT DOCUMENTS

| 4,263,010 A | 4/1981 | Randolph |
| 4,755,363 A | 7/1988 | Fujita et al. |
| 4,776,944 A | 10/1988 | Janta et al. |
| 4,909,933 A | 3/1990 | Carter et al. |
| 4,917,707 A | 4/1990 | Claramonte et al. |
| 4,919,900 A | 4/1990 | Martin et al. |

(List continued on next page.)

FOREIGN PATENT DOCUMENTS

| DE | 3708630 | * 6/1988 | ................. 117/901 |
| EP | 0 343 040 A | 11/1989 | |
| JP | 63-181312 | * 7/1988 | ................. 117/901 |
| WO | 88-2794 | * 4/1988 | ................. 117/901 |

OTHER PUBLICATIONS

Bosch, R., et al., "Experiment Equipment for Protein Crystallization in µg Facilities," *Journal of Crystal Growth*, vol. 122, pp. 310–316 (1992).

(List continued on next page.)

*Primary Examiner*—Robert Kunemund
(74) *Attorney, Agent, or Firm*—H. Jay Spiegel

(57) ABSTRACT

A method and apparatus for dynamically controlling the crystallization of molecules including a crystallization chamber (14) or chambers for holding molecules in a precipitant solution, one or more precipitant solution reservoirs (16, 18), communication passages (17, 19) respectively coupling the crystallization chamber(s) with each of the precipitant solution reservoirs, and transfer mechanisms (20, 21, 22, 24, 26, 28) configured to respectively transfer precipitant solution between each of the precipitant solution reservoirs and the crystallization chamber(s). The transfer mechanisms are interlocked to maintain a constant volume of precipitant solution in the crystallization chamber(s). Precipitant solutions of different concentrations are transferred into and out of the crystallization chamber(s) to adjust the concentration of precipitant in the crystallization chamber(s) to achieve precise control of the crystallization process. The method and apparatus can be used effectively to grow crystals under reduced gravity conditions such as microgravity conditions of space, and under conditions of reduced or enhanced effective gravity as induced by a powerful magnetic field.

20 Claims, 8 Drawing Sheets

U.S. PATENT DOCUMENTS

| | | | |
|---|---|---|---|
| 5,013,531 A | | 5/1991 | Snyder et al. |
| 5,087,338 A | | 2/1992 | Perry et al. |
| 5,106,592 A | | 4/1992 | Stapelmann et al. |
| 5,110,406 A | | 5/1992 | Sill et al. |
| 5,131,994 A | | 7/1992 | Shmidt et al. |
| 5,143,588 A | | 9/1992 | Liboff et al. |
| 5,234,566 A | | 8/1993 | Osman et al. |
| 5,248,426 A | | 9/1993 | Stillman et al. |
| 5,266,284 A | * | 11/1993 | Heilig et al. ............. 422/245.1 |
| 5,362,325 A | | 11/1994 | Shiraishi et al. |
| 5,597,457 A | | 1/1997 | Craig et al. |
| 5,641,681 A | | 6/1997 | Carter |
| 5,643,540 A | | 7/1997 | Carter et al. |
| 5,736,110 A | * | 4/1998 | Angelillo et al. ........ 422/245.1 |
| 5,961,934 A | * | 10/1999 | Arnowitz et al. ........ 422/245.1 |

OTHER PUBLICATIONS

DeLucas, L.J., et al., "Preliminary Investigations of Protein Crystal Growth Using The Space Shuttle," *Journal of Crystal Growth*, vol. 76, pp. 681–693 (1986).

DeLucas, L.J., et al., "Protein Crystal Growth in Microgravity," vol. 246, *Science*, pp. 651–654 (1989).

DeLucas, L.J., et al., "Protein Crystal Growth in Space," *Advances in Space Biology and Medicine*, vol. 1, pp. 249–278 (1991).

DeLucas, L.J., et al., "Protein crystal growth results for shuttle flights STS–26 and STS–29," *Journal of Crystal Growth*, vol. 110, pp. 302–311 (1991).

DeLucas, L.J., et al., "Recent results and new hardware developments for protein crystal growth in microgravity," *Journal of Crystal Growth*, vol. 135, pp. 183–195 (1994).

Durbin, S.D., et al., "Protein Crystallization," *Annual Review of Physics and Chemistry*, vol. 47, pp. 171–204 (1996).

Gannon, R., "The Unbearable Lightness of Space Travel," *Popular Science*, pp. 74–79 (Mar. 1993).

Hale, B., "Life Sciences in Orbit," *The Penn Stater*, pp. 54–56 (Jan./Feb. 1991).

Hale, B., "Out of This World," Information Packet from the Center for Macromolecular Crystallography, University of Alabama, Birmingham.

Henning, et al., "COSIMA—protein crystal growth facility for automatic processing on unmanned satellites," *J. Cryst. Growth*, vol. 135, pp. 513–522 (1994).

Littke, W., et al., "Protein Single Crystal Growth Under Microgravity," *Journal of Crystal Growth*, vol. 76, pp. 663–672 (1986).

Mann, P., ed., "Washington Outlook," *Aviation Week & Space Technology*, p. 23 (Aug. 1994).

"MI–405 Operating Instructions," by Microelectrodes, Inc.

"MI–900 Series Operating Instructions for All Conductivitiy Electrodes," by Microelectrodes, Inc.

Mulley, F.T., "Let There Be Light," *The Penn Stater*, pp. 34–39 (Mar./Apr. 1994).

Penn State, "An Overview—Center for Cell Research," *A Center for the Commercial Development of Space; National Aeronautics and Space Administration*.

Penn State, "The Center of Cell Research," *A Center for the Commercial Development of Space; National Aeronautics and Space Administration*, vol. 1, No. 1 (Sep. 1990).

Penn State, "The Center for Cell Research," *A Center for the Commercial Development of Space; National Aeronautics and Space Administration*, vol. 1, No. 2 (Dec. 1990).

Penn State, "The Center for Cell Research," *A Center for the Commercial Development of Space; National Aeronautics and Space Administration*, vol. 1, No. 3 (Mar. 1991).

Penn State, "The Center for Cell Research," *A Center for the Commercial Development of Space: National Aeronautics and Space Administration*, vol. 1, No. 4 (Jun. 1991).

Penn State, "The Center for Cell Research," *A Center for the Commercial Development of Space; National Aeronautics and Space Administration*, vol. 2, No. 1 (Jan. 1992).

Penn State, "The Center for Cell Research," *A Center for the Commercial Development of Space; National Aeronautics and Space Administration*, vol. 2, No. 2, (Apr. 1992).

Penn State, "The Center for Cell Research," *A Center for the Commercial Development of Space; National Aeronautics and Space Administration*, vol. 2, No. 3 (Aug. 1992).

Penn State, "The Center for Cell Research," *A Center for the Commercial Development of Space; National Aeronautics and Space Administration*, vol. 2, No. 4 (Dec. 1992).

Penn State, "The Center for Cell Research," *A Center for the Commercial Development of Space; National Aeronautics and Space Administration*, vol. 3, No. 1 (Mar./Apr. 1993).

Second International Microgravity Laboratory, IM L–2, NASDA.

Sibille, L., et al., "Analysis of solvent evaporation rates in the vapor diffusion protein crystal growth experiments from the STS–61C Space Shuttle Mission," *Journal of Crystal Growth*, vol. 110, pp. 72–79 (1991).

Sieker, L.C., "Microdialysis Crystallization Chamber," *Journal of Crystal Growth*, vol. 90, pp. 349–357 (1988).

Sjölin, L., et al., "protein crystal growth of Ribonuclease A and Pancreatic Trypsin Inhibitor aboard the MASER 3 rocket," *Journal of Crystal Growth*, vol. 110, pp. 322–332 (1991).

Snyder, R.S., et al., "Protein crystallization facilities for microgravity experiments," *Journal of Crystal Growth*, vol. 110, pp. 333–338 (1991).

Stoddard, B.L., et al., "Design of apparatus and experiments to determine the effect of microgravity on the crystallization of biological macromolecules using the MIR spacestation," *Journal of Crystal Growth*, vol. 110, pp. 312–316 (1991).

"STS–65/IML–2," *Microgravity Sciences and Application Division*.

Sygusch, J., et al., "Protein crystallization in low gravity by step gradient different method," *Journal of Crystal Growth*, vol. 162, pp. 167–172 (1996).

"The Effects of Microgravity," *Chemistry in Britain*, pp. 626–630 (Jul. 1992).

Trakhanov, S.D., et al., "Crystallization of protein and ribosomal particles in micrograavity," *Journal of Crystal Growth*, vol. 110, pp. 317–321 (1991).

Wood–Kaczmar, B., "Making the most of weightlessness," *New Scientist*, pp. 38–41 (Jul. 11, 1992).

Zeelen, et al., "The growth of yeast thiolase crystalsusing a polyacrylamide gel as dialysis membrane," *J. Cryst. Growth*, vol. 122, pp. 194–198 (1992).

* cited by examiner

DYNAMICALLY CONTROLLED CRYSTALLIZATION METHOD AND APPARATUS AND CRYSTALS OBTAINED THEREBY

This application is a continuation of application Ser. No. 09/025,475, filed Feb. 18, 1998, now U.S. Pat. No. 5,961, 934.

GOVERNMENT LICENSE RIGHTS

The U.S. Government has a paid-up license in this invention and the right in limited circumstances to require the patent owner to license others on reasonable terms as provided for by the terms of Contract No. NAS8-97010 awarded by NASA, George C. Marshall Space Flight Center, and Grant No. 2R44GM53300-02 awarded by NIH and the National Institute of General Medical Sciences.

BACKGROUND OF THE INVENTION

1. Field of the Invention

The present invention relates to the formation of crystals of small and large molecules, including macromolecules such as proteins and nucleic acids, and more particularly, to a method and apparatus for dynamically controlling the process of forming such crystals, and the resulting crystals.

2. Description of the Related Art

There is great interest in determining the three-dimensional (3-D) structures of biological molecules. Ongoing studies of the genomes of humans and other mammals, as well as of disease-causing viruses, bacteria, and parasites, are identifying thousands of genes and proteins, many of which are linked to diseases of humans and domestic animals and plants. Knowing the 3-D structures of the molecules that are involved in causing a disease can be a tremendous aid in developing drugs to prevent or treat the disease. Rational drug design involves obtaining a precise 3-D structure of a specific molecule involved in a disease process, making and studying physical models and computer-generated graphic images of the structure, as well as using sophisticated computer programs that thermodynamically model the structure and its interactions with solvent and other molecules, in order to design drugs that selectively bind to and alter the function of the disease-causing molecule. Rational drug design can be used to analyze and design drugs that interact with small molecules such as peptide and non-peptide hormones, as well as intermediate-sized and large macromolecules such as nucleic acids and proteins, respectively. The application of rational drug design will result in a number of diseases and pathological symptoms being brought under control. For example, CAPTOPRIL is a well known drug for controlling hypertension that was developed through rational drug design techniques. CAPTOPRIL inhibits generation of the angiotension-converting enzyme thereby preventing the constriction of blood vessels.

X-ray crystallography is a technology that allows us to obtain the precise 3-D atomic structures of molecules such as peptides, proteins, and nucleic acids. A critical step in using X-ray crystallography to determine the 3-D structure of any molecule of interest is establishing a reliable method for crystallizing the molecule. Proteins are one of the major classes of structural molecules in living organisms; protein enzymes catalyze the metabolic reactions that make life possible; and many disease processes are mediated by the interactions of proteins with other molecules, including other proteins. Therefore, much time and money have been spent crystallizing proteins for analysis of their structures. Recent biotechnological developments in cloning and over-expression of genes encoding proteins of interest and in the purification of proteins are increasing the need for a reliable way in which to grow protein crystals. Unfortunately protein crystallization is a difficult and unpredictable art.

Crystallization of a biological molecule such as a protein involves the creation of a supersaturated solution of the molecule under conditions that promote minimum solubility and the orderly transition of the molecules from the solution into a crystal lattice. The variables that must be controlled precisely to promote crystal growth include temperature, protein solution concentration, salt solution concentration, pH, and gravitational field, for example (Durbin, S. & Feher, G. Ann Rev Phys Chem 47 (1996) 171–204, the entire contents of which are incorporated herein by reference). These variables are carefully controlled and optimum combinations thereof are determined through experimentation to yield superior crystals.

In the description of the invention that follows, the molecule being crystallized, e.g., the protein, is referred to as a "reactant," and the solution containing one or more precipitants that is used in crystallization processes is referred to as a "reagent" solution.

The crystallization process generally involves three distinct phases; nucleation, sustained crystal growth, and termination of crystal growth. Nucleation is the initial formation of an ordered grouping of a few reactant molecules and requires a particular concentration of reactant molecules in a precipitating reagent solution. On the other hand, the continued growth phase consists of the addition of reactant molecules to the growing faces of the crystal lattice and requires lower concentrations of reagent solution than the nucleation phase. The termination phase can be initiated by poisoning the growing lattice with denatured or chemically modified reactant molecules or with different molecules, by depletion of the reactant solution, or by changing the concentration of precipitant to a specified level.

It is considered desirable to obtain a small number of crystallization nuclei quickly that will grow slowly into full-sized crystals. Theoretically, this allows for a relatively large size of the resulting crystals, homogenous crystal order and morphology, and balanced crystal dimensions. Therefore, it is desirable to begin crystallization with a reagent solution containing a particular concentration of precipitant until nucleation is detected, at which point it is desirable to adjust the concentration of precipitant. Thus, one of the critical requirements of any molecular crystallization process is the fine and dynamic control of the various parameters that determine the concentration of the precipitant in the solution in which the target reactant molecule protein is suspended. This control requires the ability to attain nucleation conditions and the ability to modify the concentration of the precipitant without disturbing the crystallization process.

There are several conventional techniques for forming molecular crystals; for example, liquid diffusion, vapor diffusion and dialysis techniques. These processes are relatively slow and cannot be readily controlled dynamically. Therefore, these processes require complex and large apparatus in order to control crystallization, if crystallization can be controlled at all. Accordingly, it is desirable to overcome these limitations.

Most conventional protein crystallization methods mix a solution containing the reactant protein molecules with a crystallizing, or precipitating, solution to accomplish crystallization. In terms of mechanics, use is commonly made of syringes, stepping motors, valves of various types, membranes to separate solutions, and in one case, a gel to replace the membrane and act as a delaying filter device between solutions. U.S. Pat. Nos. 4,917,707, 5,106,592, and 5,641,681, and Microdialysis Crystallization Chamber, L. C. Sieker, J. Crystal Growth 90 (1988) 349–357, the entire contents of which are incorporated herein by reference, disclose these concepts.

It is known to "control" the crystallization process. However, only the movement of liquids via pumps, valves and syringes is controlled in conventional crystallization processes. This control creates a static condition (bath concentration) which is predefined for the protein in question. For example, U.S. Pat. No. 4,755,363, the entire contents of which are incorporated herein by reference, discloses delivering liquids at desired flow rates and concentrations. However, U.S. Pat. No. 4,755,363 fails to disclose changing conditions within the crystallization chamber (with the exception of temperature) once those conditions have been set and crystallization has begun.

Temperature is an important parameter that can be controlled to optimize conditions separately for nucleation or growth. U.S. Pat. Nos. 4,755,363 and 5,362,325, the entire contents of which are incorporated herein by reference, are exemplary of patents disclosing temperature control in crystallization processes. U.S. Pat. No. 5,362,325 discloses varying the concentration of a crystallizing agent over time to produce a predetermined gradient in the concentration of the crystallizing agent. However, this reference fails to disclose dynamic control as disclosed for this invention.

Automation is a recent trend in crystallography. Robotics enables systematic pipetting of solutions and protein into crystal growth chambers on plates, so that a multiplicity of conditions can be examined more quickly and consistently. The use of robotics frees valuable time for researchers. Another trend is the use of semi-automated techniques to record results.

Also, inherent to any crystallization process that proceeds in a finite gravitational field are the effects of molecular convection, thermal effects, sedimentation, and buoyancy. Crystallization experiments that have been conducted in microgravity (1/1000 g to 1/10,000 g) on board the Space Shuttle, Space Station, and other vehicles, indicate that larger and more homogenous crystals can be grown in microgravity environments by eliminating the effects of the earth's gravitational field. Several patents disclose crystallization in microgravity to improve the size, morphology and diffraction quality of crystals. U.S. Pat. Nos. 5,362,325 and 4,755,363, which are incorporated herein by reference, are exemplary of patents disclosing microgravity crystallization. In fact, a low gravity environment is "crucial" (emphasis added) to the success of one apparatus (Sygusch, et al. J. Crystal Growth 162 (1996) 167–172). However, the practical limitations of using current space vehicles, such as the Space Shuttle, render it difficult to use conventional apparatus/methods for crystallization in microgravity environments. Particularly, conventional apparatus are too large, are difficult to control remotely and automatically, have many moving parts that can fail, do not permit accurate change of solution concentration during the process and are not entirely reusable. Also, known processes require too much time to produce fully grown crystals. Therefore, it is desirable to overcome these deficiencies to permit crystal growth experiments in space under conditions in which gravity ranges below earth gravity down to microgravity conditions. Also, conventional apparatus and methods do not facilitate experimentation in which the only variable is the presence or absence of the earth's gravitational field because conventional crystallization apparatus must be modified significantly for use in space. Given the unpredictable, multifactorial nature of the crystallization process, and its dependence on the structure of the molecule which is being crystallized, it is also envisioned that some molecules will crystallize efficiently in gravitational fields that are greater than earth's gravitational field. The foregoing methods and apparatus do not provide a dynamic control capability, either in the earth's gravitational field or in gravitational fields that are greater or lesser than earth's gravitational field.

The advantages obtained by growing crystals in reduced gravity in space can also be obtained on the earth's surface by growing crystals under conditions in which the effective gravitational field ($g_{eff}$) is reduced as a result of diamagnetic effects induced by a very high magnetic field. Provided that a magnet of sufficient strength is used, a solution containing reactant molecules can be moved to positions with respect to the center of the magnet so that the reactant molecules experience $g_{eff}$ forces that range between zero and twenty times normal earth gravity (E. Beaugnon et al., Nature (1991) 349:470). A study of lysozyme crystallization under conditions where $g_{eff}$ was varied magnetically from 0.95 to 1.05 g suggested that crystal growth is enhanced in a strong magnetic field, possibly because alignment of the reactant molecules in the magnetic field leads to formation of more ordered crystals (N. I. Wakayama et al., J. Crystal Growth (1997) 178:653; see also, G. Sazaki et al., J. Crystal Growth (1997) 173:231). None of the foregoing references discloses methods or apparatus that provide a dynamic control capability for crystallization under magnetically-induced effective gravitational fields where $g_{eff}$ is greater or lesser than normal earth gravity.

SUMMARY OF THE INVENTION

The present invention is a Dynamically Controlled Crystallization System (DCCS) that includes apparatus and methods that can be used to control a molecular crystallization process precisely and dynamically.

The present invention can be further used to monitor and control a molecular crystallization process remotely in real time.

The present invention can be further used to control a molecular crystallization process in a predetermined manner.

The present invention permits initiation, termination or reversal of a molecular crystallization process.

The present invention permits reduction in the size and number of moving parts in a molecular crystallization method and apparatus.

The present invention permits production of molecular crystals in a sealed system.

The present invention can be used to produce molecular crystals under conditions of real and simulated gravity in the range of from about zero times the earth's gravitational field to about 20 times the earth's gravitational field, and to produce crystals in earth's gravitational field, with identical apparatus.

The present invention permits crystallization parameters to be controlled in a sealed system without changing the pressure in the crystallization chamber.

The present invention can be used to optimize the time required to produce large, well-ordered molecular crystals.

The present invention can be used to optimize crystallization conditions while using less experiments and substantially less reactant, e.g. protein.

"Dynamic control" as used herein means that: (1) the crystallization process can be started at will, (2) several conditions that are important for the growth of molecular crystals, such as pH, conductivity, and temperature, can be measured in the crystallization chamber, (3) decisions regarding altering the conditions affecting crystal growth can be made based upon monitoring crystal nucleation and growth, (4) these conditions can be precisely controlled at any time during the crystallization process, (5) the crystallization process can be modified or stopped when desired and (6) the process can be reversed if so desired.

In order to achieve these objectives, a first aspect of the invention includes at least one crystallization chamber for holding a solution containing reactant molecules that is separated by a permeable membrane from a reagent solution comprising a precipitant at a first concentration, at least one source reservoir comprising reagent solution having precipitant at a second concentration that is coupled via a communication passage with the reagent solution in the crystallization chamber, and at least one drain reservoir that is coupled via a separate communication passage with the reagent solution in the crystallization chamber, and transfer mechanisms configured to respectively transfer reagent solution between the at least one source reagent solution reservoir and the crystallization chamber, and to concurrently transfer reagent solution from the crystallization chamber to the at least one drain reservoir. The transfer mechanisms can work in tandem to simultaneously transfer equal amounts of precipitating solution into and out of the crystallization chamber, to thereby alter the concentration of precipitant in the reagent solution in the crystallization chamber with respect to time. In this manner, the concentration of the precipitant in the reagent solution in the crystallization chamber can be adjusted dynamically to provide optimum crystallization conditions with respect to time.

The invention can also be configured so that two or more pairs of source/drain reservoirs, each containing a different reagent solution, are respectively coupled via separate solution communication means to the reagent solution in the crystallization chamber, with separate solution transfer means to transfer reagent solutions tandemly from the source reservoir to the crystallization chamber, and from the crystallization chamber to the respective drain reservoir, for each pair of reagent reservoirs. The paired source and drain reservoirs can be operated sequentially, i.e., one pair at a time, with time allowed for diffusion-mediated mixing of the reagent solution in the crystallization chamber between transfers, so that precipitant concentration in the reagent and reactant solutions in the crystallization chamber is changed in an even, controlled manner.

The invention also can be configured with two or more crystallization chambers coupled in series via solution communication means, with at least one source reagent solution reservoir being coupled to the reagent solution of the first crystallization chamber in the series, and at least one drain reservoir being coupled to the reagent solution of the last crystallization chamber in the series. Tandem transfer of a volume of reagent solution from a source reservoir to the first crystallization chamber, and from the last crystallization chamber to a drain reservoir, results in transfer of an equal volume of reagent solution from each crystallization chamber in the series to the next one, thereby establishing a concentration gradient of a precipitant in the reagent solution across the series of crystallization chambers.

The invention can also be configured so that two or more crystallization chambers are coupled via a manifold solution communication means to at least one source reagent solution reservoir, and are also coupled via solution communication means, directly or indirectly, to one or more drain reservoirs, so that the same volume of reagent solution can be transferred simultaneously from the source reservoir to each of the two or more different crystallization chambers.

By configuring crystallization chambers according to the invention so that the reactants in different crystallization chambers experience a range of different precipitant concentrations and other parameters that affect crystallization; e.g., in multiple series, or in 2- and 3-dimensional arrays, the invention permits controlled variation of the concentrations of one or more precipitants during the process, resulting in establishing conditions for crystal growth, optimization, termination or reversal of the crystallization process, and conservation of the molecular crystal. The invention thus permits the crystallization process to be controlled easily, merely by operating the transfer mechanisms.

Another important feature of the present invention is that it has real time remote-controlled operative capabilities, and can easily be used under normal earth gravitational conditions, as well as in environments in which the real or simulated gravitational field is greater or less than earth's gravitational field.

The invention also permits a complex set of variables in the process of crystal growth to be rigorously examined, manipulated and controlled so that gravity is the only variable. Due to its compactness and ease of operation, the present invention is conservative in terms of cost containment for flights aboard the Space Shuttle and the International Space Station. Use of this invention conserves both money and valuable astronaut time. The present invention can remain on a space platform for many sets of experiments, while the crystallization chamber can return to earth with the molecular crystals that are produced in space. New chambers, tubing and syringes can be delivered on the next flight pre-loaded. Furthermore, the invention can be readily miniaturized so that it is even more compact than the embodiments shown in the examples disclosed herein, and thus the entire unit can be made even less expensive to transport to and from space.

The present invention further provides methods for carrying out dynamically controlled crystallization of proteins and other molecules under conditions in which the effective gravitational force resulting from diamagnetism in a high magnetic field (i.e., 16 Tesla or more) is in the range of zero to 20 times earth's gravitational field.

Another important feature of the invention is that the apparatus is compact and easily sealed to the air. Sealing the system permits operation without adverse effects on fluid flow and the sieving properties of the dialysis membrane in the crystallization chamber being caused by changes in air pressure. Sealing also prevents contamination of the solutions in the system sample for further experimentation.

An additional feature of the invention is that it produces crystals in a reduced time with few moving parts and low power requirements.

DETAILED DESCRIPTION OF THE INVENTION

Figure 1:
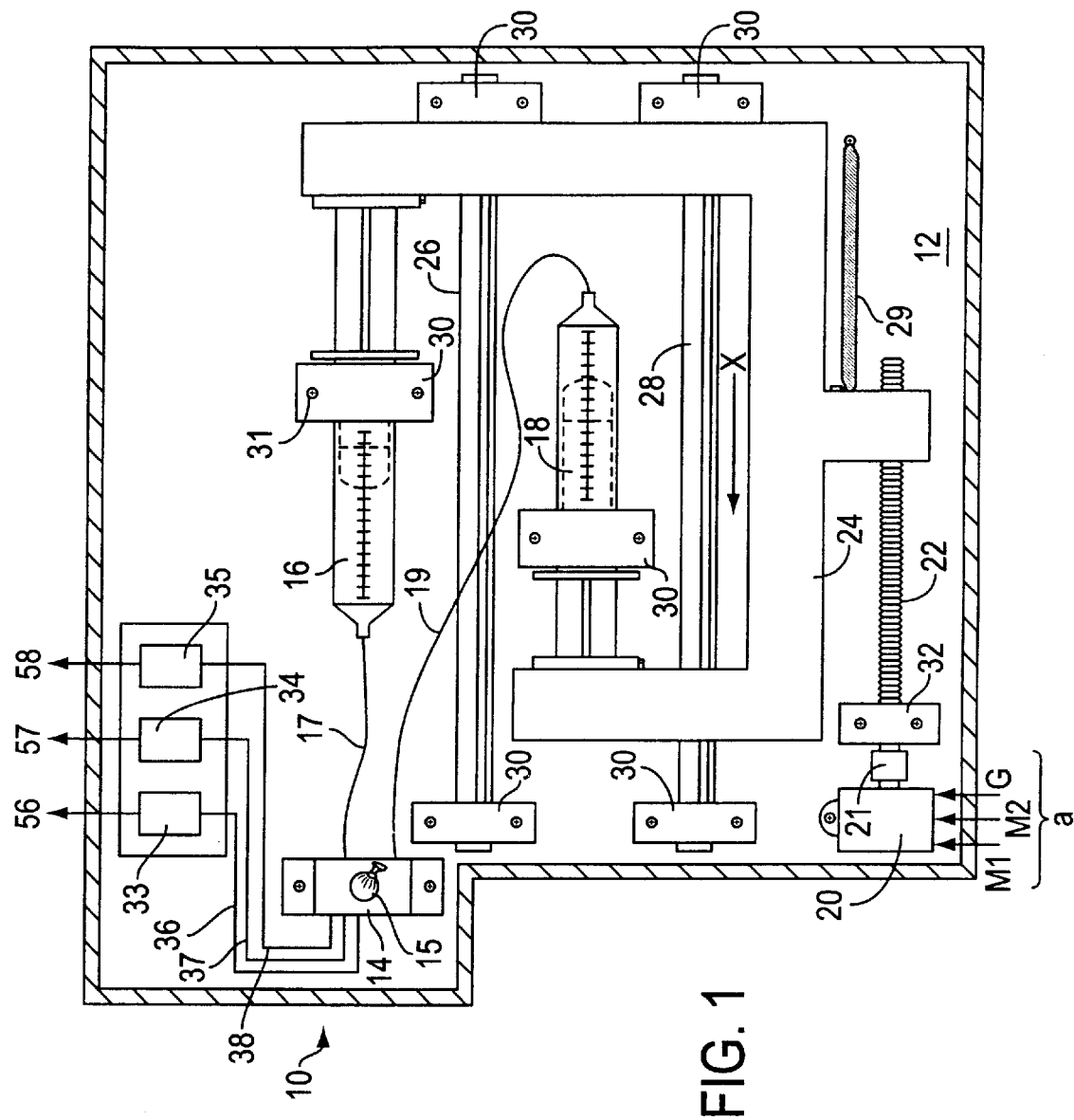
FIG. 1 is a detailed schematic view of a crystallization apparatus of the invention.

While specific embodiments and preferred methods and materials of the invention are described herein, the invention is not limited to the particular methodology, protocols, and materials described. It is understood that methods, materials, and devices similar or equivalent to those described herein can be used successfully in the practice or testing of the present invention, and that the present invention as described herein is capable of further modifications. This application is intended to cover any variations, uses, or adaptations of the invention following, in general, the principles of the invention and including such departures from the present disclosure as come within known or customary practice within the art to which the invention pertains and as may be applied to the essential features set forth herein and as follows in the scope of the appended claims. All publications, patents, and patent applications mentioned herein are incorporated by reference for the purpose of describing and disclosing the materials and methodologies which are reported in the publications, patents, and patent applications, which might be used in connection with the invention. Unless defined otherwise, all technical and scientific terms used herein have the same meaning as commonly understood by one of ordinary skill in the art to which this invention belongs. It must also be noted that as used herein and in the appended claims, the singular forms "a", "and," and "the" include plural reference unless the context clearly indicates otherwise. For example, reference to "a molecule to be crystallized" includes a plurality of such molecules. The present invention comprises an apparatus and method for producing molecular crystals that permit the monitoring of crystal growth and dynamic control of the crystallization conditions so that large, high quality crystals are produced in a relatively short times. The methods and apparatus of the present invention can be used to crystallize molecules ranging in size from small organic compounds of about 10–30 atoms up to large macromolecular complexes comprising tens of thousands of atoms. The description that follows often refers to using the method and apparatus of the present invention to crystallize a protein; however the methods and apparatus described herein can be used with equal success to crystallize molecules other than proteins, such as small organic molecules and medium-sized molecules such as oligonucleotides and oligopeptides.

The term "reactant" as used herein refers to the molecule that is being crystallized.

The terms "precipitant" and "reagent" as used herein refer to chemical compounds which affect the solubility of the molecules being crystallized and which, depending on their concentration, can promote or inhibit crystal growth in crystallization processes. Examples of chemical compounds that are precipitants are salts, polyethylene glycol, and small organic molecules (Durbin, S. & Feher, G., Ann. Rev. Phys. Chem. (1996) 47:173).

The term "reagent solution" as used herein refers to a solution comprising one or more precipitants.

FIG. 1 illustrates protein crystallization apparatus 10 in accordance with the invention. Apparatus 10 includes rigid base plate 12, crystallization chamber 14 in which crystallization is to occur, syringe 16, syringe 18, lead screw 22, yoke 24, and guide rods 26 and 28. Solution containing the reactant molecules to be crystallized is removably disposed inside crystallization chamber 14. Syringe 16 is coupled to crystallization chamber 14 by tube 17 serving as a conduit. Syringe 18 is coupled to crystallization chamber 14 by tube 19 serving as a conduit. Syringes 16 and 18 serve as reagent solution reservoirs as described in detail below. Plungers of syringe 16 and syringe 18 face in opposing directions and are coupled to yoke 24 which serves as an interlock as described below. Further, yoke 24 is disposed so that it slides on guide rods 26 and 28. Lead screw 22 is coupled to a shaft of motor 20 via aligning coupling 21 and is engaged with yoke 24 via a threaded bushing. Syringe 16, syringe 18, guide rod 26 and guide rod 28 are fixedly coupled to base plate 12 by mounting blocks 30 and screws 31 as shown. Mounting block 32 is fixed to base plate 12 by screws 31 and has a bearing for permitting rotation of lead screw 22 while axially fixing lead screw 22 to base plate 12. Further, crystallization chamber 14 and stepper motor 20 are also fixed to base plate 12 by screws 31. Spring 29 is coupled to base plate 12 by screw 31 at one end and to yoke 24 at another end to bias yoke 24 in one direction against threads of lead screw 22 to thereby minimize backlash when yoke 24 is moved linearly as described below. The invention operates successfully without spring 29, and its use is optional.

The reactant molecules that can be crystallized by the present invention include, but are not limited to, macromolecules such as proteins, nucleic acids in combination with proteins, proteins bound to lipids and glycolipids. If the reactant molecules are membrane-bound proteins, a detergent can be introduced into the crystallization chamber at an appropriate time, by a micro-syringe, or the like, to separate the protein from the membrane. The reactant molecules can also be small molecules such as drug molecules, co-factors, amino acids, nucleotides, hormones and other signaling and regulatory molecules, and analogs of the foregoing. Medium-sized molecules that can be crystallized by using the present invention include, but are not limited to, peptides, protein fragments, and oligonucleotides. Large macromolecular complexes such as viruses can also be crystallized using the present invention.

Figure 3:
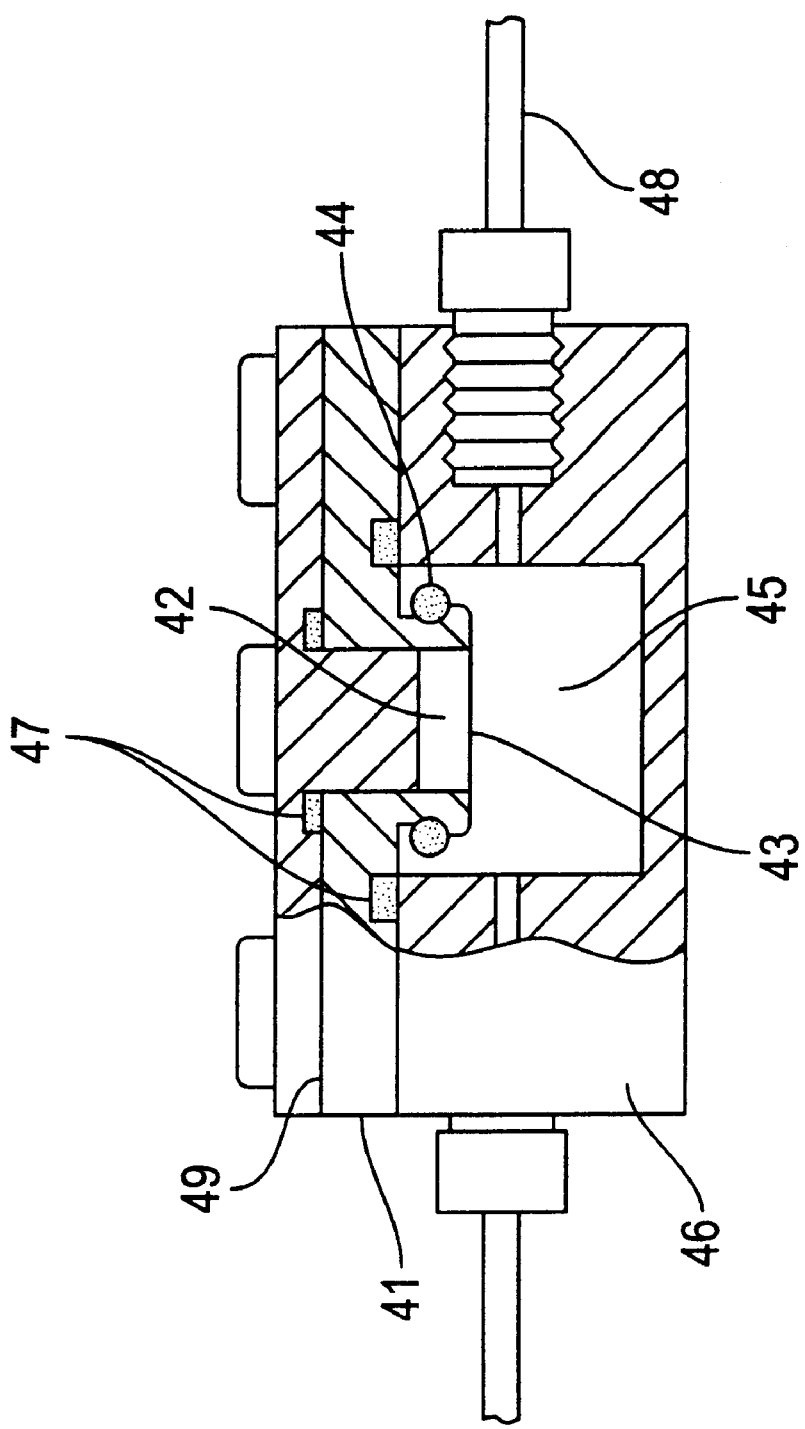
FIG. 3 is a detailed schematic view of an embodiment of a crystallization chamber in which a dialysis membrane separates reactant solution in a chamber in the top assembly from reagent solution in the lower portion.

Crystallization chamber 14 comprises a system for retaining the reactant molecules, but allowing for the passage of smaller molecules. A permeable membrane, porous diaphragm, or permanent sieve, having a molecular weight cut-off of a predetermined value may be used in this regard. For example, the membrane may be a dialysis bag or a sheet of dialysis membrane. In any case, the molecular weight cut-off should be lower than the molecular weight of the reactant molecules in the crystallization chamber, and should significantly reduce movement of the reactant molecules out of the crystallization chamber. However, the membrane or sieve should not significantly hinder the movement of smaller precipitant molecules, e.g., ions and non-ionic solutes. In one embodiment, a solution containing reactant macromolecules to be crystallized is loaded into the crystallization chamber for retention of the macromolecules, and reagent solution is disposed around the dialysis sack to completely fill the crystallization chamber, as shown schematically in FIG. 1. In a preferred embodiment, the crystallization chamber comprises a sieving membrane such as a dialysis membrane that separates the crystallization chamber into two compartments, one of which contains reactant solution, and the other of which contains a reagent solution. For example, the crystallization chamber can comprise a top cover that includes a recessed portion; the cover itself may be recessed for this purpose, or the cover may comprise a button-shaped protrusion that is recessed for this purpose. Preferably the cover comprises a recess that serves as a compartment into which is put solution containing reactant molecules for crystallization. The recess is than covered by a membrane as described above. An elastic O-ring, gasket or other retainer may be used to hold the membrane in place. A preferred embodiment of the crystallization chamber is shown in FIG. 3. Transparent top cover 49 comprising a cylindrical protrusion is fitted onto inside cover 41 with the center protrusion of cover 49 fitting into the central hole and partially through the hollow cylindrical protrusion of cover 41 to form recession 42, and is secured in place with three screws. Recession. 42 is filled with reactant solution containing the molecule to be crystallized, and the opening is covered with dialysis membrane 43 that is held in place with an O-ring 44. Alternatively, the opening at the bottom of the perforated, cylindrical protrusion of inside cover 41 is obturated with a dialysis membrane 43 that is held in place with an O-ring 44, and reservoir 45 in the lower, portion of the crystallization chamber 46 is filled with the desired reagent. The inside cover is then placed on the lower portion 46 so that the exposed surface of the dialysis membrane is fully in contact with the reagent solution and there are no air bubbles in the crystallization chamber, and the inside cover is secured in place with three screws. Reactant solution, e.g. a solution containing a protein to be crystallized, is added through the hole in the top of the inside cover to the recess having as its base the upper surface of the dialysis membrane. Transparent top cover 49 is then placed on the inside cover with the center protrusion fitting into the central hole of the inside cover, and is secured in place with three screws. Cover seals 47 prevent solution from leaking out of the chamber. The volume of recession 42 that is formed when the two covers are assembled is determined by the diameter of the hole through the inner cover, and the difference in the length of the hollow cylindrical protrusion extending from the inner cover and by the length of the solid cylindrical protrusion extending from the top cover. The volume of recession 42 can range from about 10 microliters to 500 microliters or more. The volume of the reagent solution reservoir 45 in the lower chamber can range from about 50 microliters to 10 ml or more. In a preferred embodiment, the volume of recession 42 is about 50 microliters, and the volume of reagent solution reservoir 45 is one ml. The invention also includes other ways to retain the reactant molecules in the crystallization chamber that will be readily apparent to those skilled in the art.

A reagent solution is loaded into syringe 16, and optionally into syringe 18 also. Each of the reagent solutions that are used in the crystallization chamber and syringes can contain one or more of any precipitants having ionic or chemical characteristics that, at the appropriate concentration, permit crystallization of the protein. The relative concentrations of reagent solution in the crystallization chamber(s) and in the solution chambers can be varied, based on crystallization conditions. The apparatus and method of the present invention are used to raise or lower the concentration of reagent solution in the crystallization chamber(s) to a desired value for crystallization.

The conduits that carry reagent solution between the paired reagent solution reservoirs and the crystallization chamber are connected to the portion of the crystallization chamber containing reagent solution at any points that are sufficiently far apart that the reagent solution introduced into the crystallization chamber from the source reservoir is well mixed with the reagent solution in the crystallization chamber before being drawn out of the crystallization chamber and into the conduit leading to the drain reservoir. For example, FIG. 1 shows tubing 17 and 19 from syringes 16 and 18, respectively, making connection to the same side of crystallization chamber 14, and FIG. 3 shows the tubing from the source and drain reagent solution reservoirs making connection to opposite sides of the crystallization chamber. For additional clarity, FIG. 3 has a cutaway view in which the threaded insert of the inlet tube 48 is shown.

Activation of motor 20 will cause lead screw 22 to rotate and thereby will cause yoke 24 to slide linearly along guide rods 26 and 28. Linear motion of yoke 24 will cause the plunger of syringe 16 to move in one direction and will cause the plunger of syringe 18 to move in the opposite direction through the same distance. The simultaneous, opposing motions of the plungers in the two syringes cause one syringe to inject a drop of reagent solution into the reagent reservoir of the crystallization chamber while the other syringe withdraws an equal volume of solution from the same reservoir. For example, activation of motor 20 in a direction causing yoke 24 to move in the direction of arrow X shown in FIG. 1 will cause reagent solution stored in syringe 16 to be transferred into crystallization chamber 14 while simultaneously causing reagent solution to be transferred out of crystallization chamber 14 and into syringe 18. If the concentration of precipitant in the reagent solution resulting in crystal formation is known, the respective concentrations of precipitant in the reagent solutions in crystallization chamber 14, syringe 16, and syringe 18, can be set to the appropriate different values prior to crystallization, and the concentration of precipitant in the reagent solution in crystallization chamber 14 can be controlled with respect to time by operating motor 20 in a desired manner over time. The optimal time period for dynamically adjusting the precipitant concentration in the crystallization chamber to a concentration giving crystals of the desired size can then be determined empirically.

For example, for certain proteins, it has been found that a salt concentration of about 0.15 M (moles/liter) in the reagent solution facilitates crystallization. Also, it has been found that it is desirable to approach this concentration very slowly and that the rate of approach can be critical in yielding desired results. Therefore, in the preferred embodiment, crystallization chamber 14 and syringe 18 can initially contain reagent solutions comprising precipitant at a concentration that is sufficiently high that crystallization does not occur (1 M salt, for example), and syringe 16 can initially contain a reagent solution comprising precipitant at a concentration that is lower than the concentration that permits crystallization (0.1 M salt, for example). With this arrangement to initiate a crystallization process, motor 20 can be activated to move yoke 24 in the direction of arrow X in FIG. 1, to thereby transfer a small amount of low concentration reagent solution from syringe 16 into crystallization chamber 14 and simultaneously transfer high concentration reagent solution from crystallization chamber 14 into syringe 18. It can be seen that this procedure lowers the concentration of the precipitant in crystallization chamber 14. Motor 20 can be activated in desired increments in a pre-programmed manner to change the concentration of the solution in crystallization chamber 14 to a desired value over a selected period of time. In preferred embodiments, sensors are placed in the crystallization chamber, in the syringes, or at appropriate positions to detect solution concentration, temperature, position, pressure or other variables, and one or more monitoring systems are used to monitor crystal nucleation and growth in the crystallization chamber. The measurements made by such sensors and monitoring systems during the crystallization process are used to control the crystallization process in a dynamic manner. Motor 20 can then be stopped when it is determined that the concentration of the precipitant in crystallization chamber 14 has reached an optimum level for initiating crystallization (0.15 M salt, for example). Further, motor 20 can be operated to move yoke 22 in a reverse direction, i.e. a direction opposite arrow X, to cause solution to flow from syringe 18 into crystallization chamber 14 and from crystallization chamber 14 into syringe 16, to thereby raise the concentration of precipitant in crystallization chamber 14. In this manner, the concentration of precipitant in crystallization chamber 14 can be finely adjusted and raised or lowered to a value which will stop, or even reverse, the crystallization process, thereby giving precise dynamic control of the crystallization process.

Any appropriate motor can be used. For example, motor 20 can be a stepper motor (e.g., Model No. STP 42 ND 4BLVE-100 manufactured by EPSON AMERICAN). Likewise, any type of controller, such as a digital or analog programmable controller, that facilitates predetermined programmable control of the crystallization process, as described below, can be used to control motor 20 (e.g, the MTSD-V1 motor driver, manufactured by MODERN TECHNOLOGY, INC.). For use in space, all components, including the motor and controller may have to be certified or approved by the appropriate regulatory authority.

Figure 2:
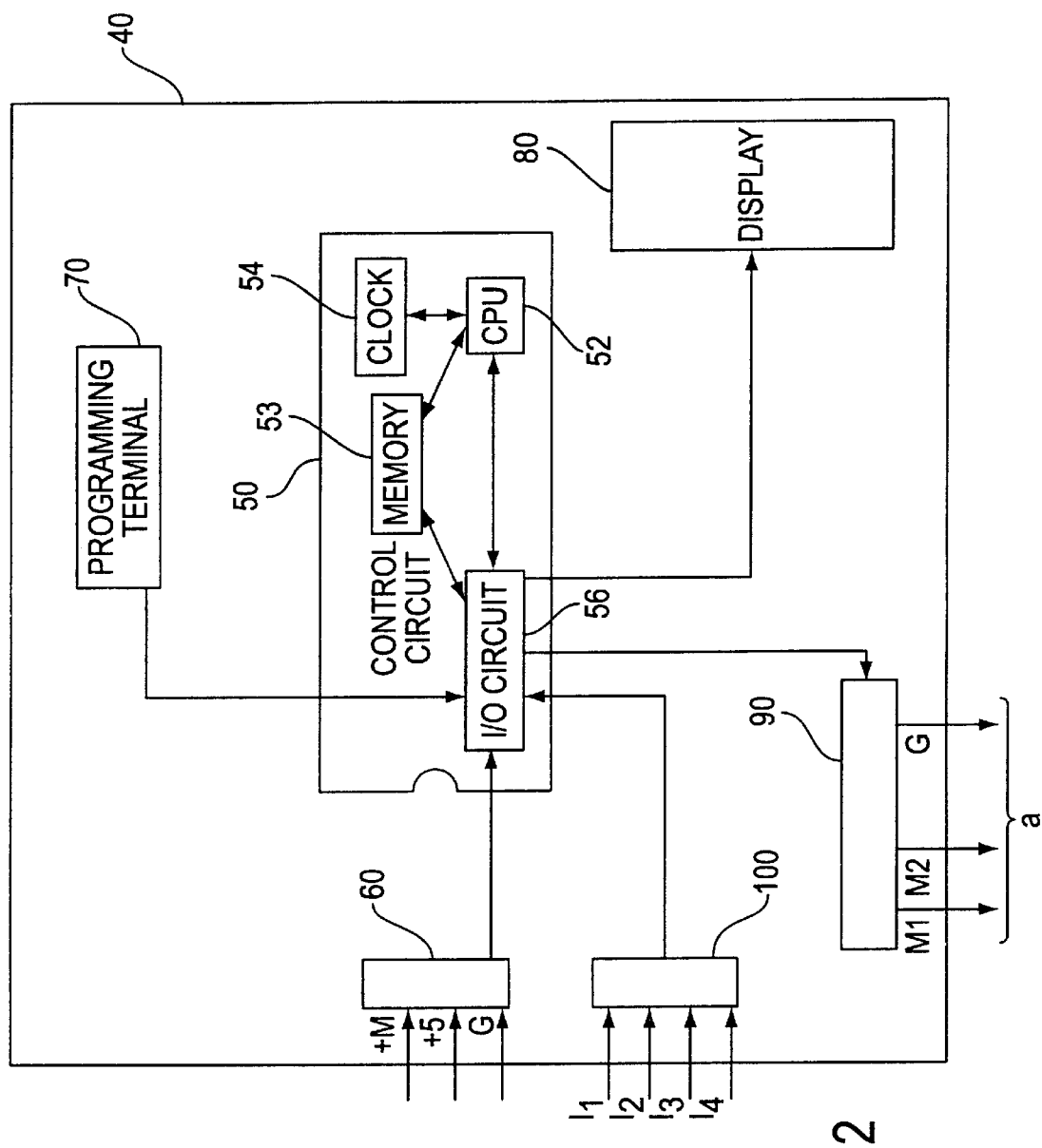
FIG. 2 is a schematic illustration of a controller for controlling the crystallization apparatus.

FIG. 2 is a schematic illustration of controller 40 for controlling motor 20 and thus the crystallization process. Controller 40 is constituted of control circuit 50, input connector 60, programming terminal 70, display 80, output connector 90, and input connector 100. Control circuit 50 includes CPU (central processing unit) 52, I/O circuit 56, clock 54, and memory 53. Control circuit 50 can be a conventional microprocessor-based device, such as a personal computer or an industrial programmable controller, or control circuit 50 can be a dedicated solid state, hard-wired, digital, analog or mechanical controller, for example. Clock 54 generates pulses at regular intervals in a conventional manner to provide timing for the operation of the other components. Memory 53 contains operating instructions for CPU 52 to carry out the crystallization process. The operating instructions can be in the form of preprogrammed software in the case of a digital controller, hard-wired components in the case of an analog controller or mechanical elements, such as cams, in the case of a mechanical controller. I/O circuit 56 provides an interface between CPU 52 and external components such as motor 20, programming terminal 70, display 80 and any sensors or actuators.

Input connector 60 includes three input connections for motor voltage (+M) a 5 volt D.C. logic voltage (+5), and a ground (G). Input connections of connector 60 are coupled to I/O circuit 56. Output connector 90 includes output connections for a first winding of motor 20 (M1), a second winding of motor 20 (M2) and ground (G). Output connections of connector 90 are coupled to I/O circuit 56 and to stepper motor 20 at (a) (as indicated in FIGS. 1 and 2.) Programming terminal 70 is coupled to CPU 52 through I/O circuit 56 to permit operating instructions to be input into the memory 53 of CPU 52. Programming terminal 70 can consist of any input device such as a keyboard, a touch screen, a bank of switches, push buttons, or the like. Once the operating instructions are stored in memory 53, programming terminal 70 can be disconnected from I/O circuit 56 or can remain connected to I/O circuit 56. Display 80 also is coupled to CPU 52 through I/O circuit 56 and serves to display operating parameters or status relating to the operation of controller 40. For example, display 80 can be a CRT, LCD display, LED display or similar device. Of course, display 80 is optional.

Once the operating instructions are stored in memory 53 through conventional programming and storage techniques, the proper input voltage is supplied to input connector 60 and output connector 90 is coupled to stepper motor 20. Controller 40 can control motor 20 to operate in a predetermined manner with respect to time to thereby control the crystallization process in a desired manner. Of course, if the initial concentrations of precipitant in reagent solutions in syringes 16 and 18 and in crystallization chamber 14 are known, and the volumes of crystallization chamber 14, syringe 16, and syringe 18 are also known, the operating instructions stored in memory 53 can be configured to control the crystallization process, i.e., the concentration of precipitant in crystallization chamber 14 in a dynamic manner with respect to time to provide desirable crystallization conditions at all times. Input connector 100 includes inputs $I_1-I_4$ for coupling additional inputs, such as limit switches, sensors, and the like, to CPU 52 through I/O circuit 56. This permits closed-loop control to be achieved, based on the state of the crystallization process or other variables. Additionally, these inputs can be coupled to switches, or the like, for initiating, terminating, interrupting or changing the operation of CPU 52. Of course the operating instructions stored in memory 53 can be programmed in accordance with any desired operation and external inputs or outputs.

Figure 4:
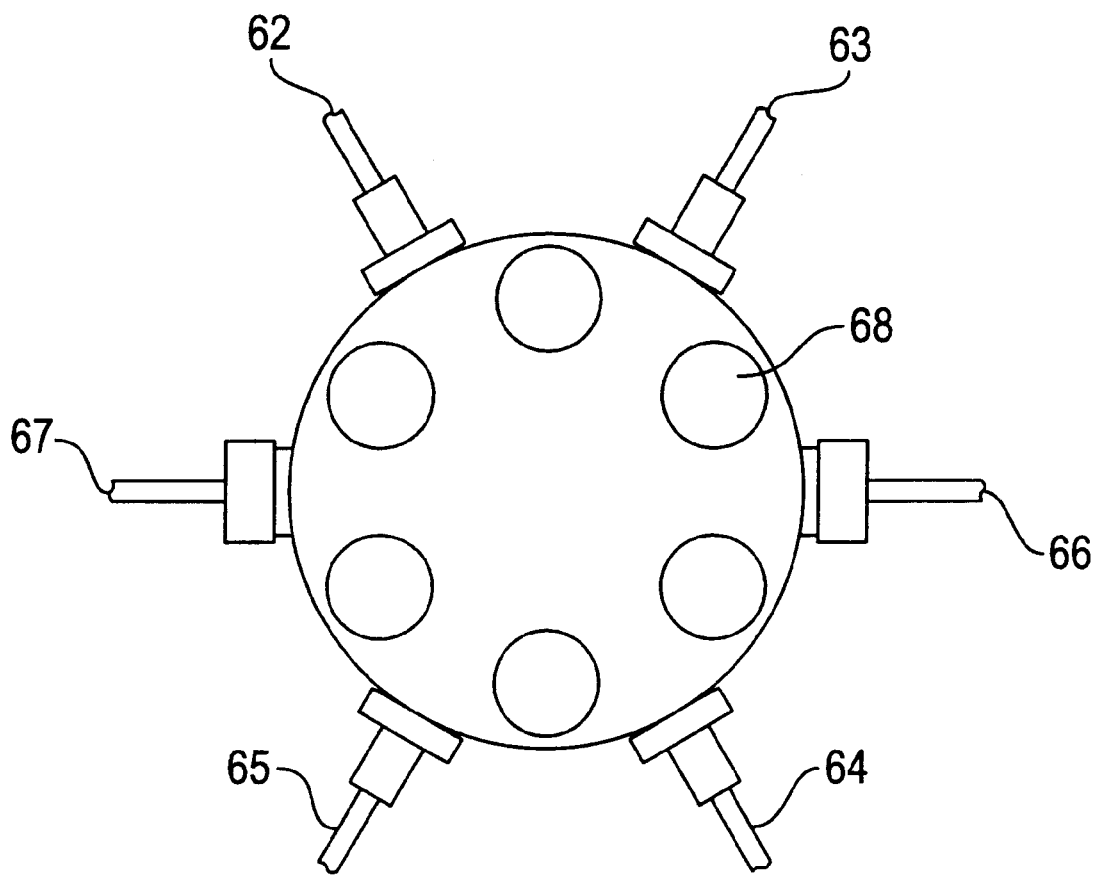
FIG. 4 is a detailed top view of an embodiment of a crystallization chamber, showing attached ionic strength, pH, and temperature probes.

As noted above, one or more sensors can be attached to the crystallization chamber to provide feedback to permit closed loop control. For example, when the precipitant is a salt, a sensor which measures the electrical resistance or other electrical properties of a salt solution in crystallization chamber 14 can be used to indicate the concentration of the solution in the crystallization chamber, because electrical properties of the salt solution change as the concentration changes. Additional sensors which measure pH and temperature of the reagent solution in the crystallization solution can also be attached to crystallization chamber 14. Sensors that measure ionic strength and pH that are suitable for use in the present invention can be obtained, for example, from Microelectronics, Inc., 40 Harvey Rd., Bedford, N.H. Temperature sensors that are suitable for use in the present invention can be obtained, for example, from Bioserve Space Technologies, University of Colorado, Boulder, Colo. FIG. 4 is a top view of a preferred embodiment of a crystallization chamber of the present invention, showing the configuration for the attachment of a pH reference probe 62, a conductivity probe 63, a pH measurement probe 64, and a temperature probe 65. The inlet tube 66, outlet tube 67, and screws 68 securing the top of the crystallization chamber are also shown. FIG. 1 schematically illustrates an embodiment of the apparatus of the present invention comprising a single crystallization chamber 14 to which is attached an ionic strength sensor 33, a pH, sensor 34, and a temperature sensor 35. Leads 36, 37, and 38 connect the sensors to ionic strength, pH, and temperature probes that are in contact with the reagent solution in crystallization chamber 14. Output lines 56, 57, and 58 carry ionic strength, pH, and temperature information to the controller (40 in FIG. 2), and correspond to one or more of the inputs $I_1$–$I_4$ shown in FIG. 2.

In preferred embodiments of the present invention, crystal nucleation and growth in the crystallization chamber are monitored by any of the methods known to those in the art of growing molecular crystals. For example, the crystallization chamber can have a transparent cover, and crystal nucleation and growth can be monitored by looking at the contents of the reagent reservoir or dialysis sac within the crystallization chamber with an appropriate magnifying device; e.g., a microscope. Viewing and visual recording devices to image the interior of the crystallization chamber 14 are not shown; however, such devices are commonly used to evaluate crystal nucleation and growth, and can readily be employed with the present invention by one skilled in the art. Such devices may include, but are not limited to, a camera to take static photographs, a video-recording device, a magnifying device, and a magnifying device in tandem with a video-recording device. Alternatively, early crystal growth can be detected by directing fiber optic leads to the reagent solution that direct light into the solution and measure the light scattering (for example, see Durbin & Feher, 1996, p. 184). As the crystallizing protein comes out of the reactant solution, it changes the electrolytic properties of the reagent solution. As a result, nucleating crystals can be detected by introducing conductive wires into the reagent solution that function as the plates of a capacitor. Frequency changes of the RLC oscillator produced in this manner are an indication of crystal growth.

In the preferred embodiment, syringes are used to store reagent solutions, and plungers of the syringes are moved by a yoke to transfer the reagent solutions into and out of the crystallization chamber(s). In embodiments having two or more pairs of source and drain syringes, each pair of syringes can be coupled to a different motor-driven yoke so that it can be operated independently of the others. However, any arrangement for delivering reagent solution to and from the crystallization chamber(s) can be used. For example, two or more reservoirs, each pair having pumps which are electrically or mechanically interlocked, can be used, or a single reservoir or syringe can be used and any excess reagent solution can be allowed to drain into a reservoir or the atmosphere, or a valve arrangement can be used. Any solution communicating means can be used as the solution conduits that direct reagent solution between the reagent solution reservoirs and the crystallization chamber. For example, plastic, glass, or metal tubing, or a fluid-transporting channel in a chip (e.g., silicon), would be suitable for the present invention. Any mechanism can be used to coordinate transfer of reagent solution to and from the crystallization chamber(s), such as a software interlock programmed into the controller or any other mechanical interlock. In addition, the reagent solution can be transferred to a test tube, beaker, or other suitable container, into which is placed a dialysis bag filled with a solution containing the molecule to be crystallized. The test tube, beaker, or other suitable container can then function as the above-described crystallization chamber, with the selected reagent solutions being pumped or injected into and out of the solution holding the dialysis bag, to dynamically alter the composition of the solution surrounding the dialysis bag to one which produces crystals.

As noted above, the apparatus of the present invention can include multiple, independently controlled sets of syringes that are attached to a crystallization chamber. In one such embodiment, a first set of syringes can be attached to a crystallization chamber to deliver a solution containing a precipitant that is appropriate for promoting nucleation and crystal growth, and a second set of syringes can be attached to the same crystallization chamber to deliver a solution containing a salt that is appropriate for stabilizing and storing the crystal for a prolonged period of time. Once a crystal of suitable size has been produced by altering precipitant concentration using the first set of syringes, fluid from the second set of syringes can be admitted into the reagent reservoir in the crystallization chamber through a very narrow bore access tube (<0.2 mm) or other suitable outlet, while an equal volume of fluid from this area may be concurrently pumped out of this area of the chamber through a very narrow bore access tube (<0.2 mm) or other suitable outlet, until the desired concentration of stabilizing salt solution in the crystallization chamber is attained.

The foregoing disclosure describes embodiments of the present invention having a single crystallization chamber, as shown in FIG. 1. When conditions that produce crystals of useful size and quality are known, an apparatus having a single crystallization chamber can be used to efficiently change the concentration of one or more precipitants, e.g., salts, in the crystallization chamber in a controlled, coordinated manner to produce the conditions giving crystallization, thereby permitting the time required for growing crystals to be shortened or optimized. The apparatus having a single crystallization chamber is also useful for comparing crystal growth under diverse conditions; for example, in different gravitational fields, or at different temperatures.

The crystallization conditions giving well-ordered crystals for a given protein or other molecule are often unknown or have not been optimized. In this case, embodiments of the apparatus of the present invention that comprise multiple crystallization chambers and are capable of varying multiple solution parameters in the different crystallization chambers can be used to identify conditions that promote growth of good crystals.

Figure 5:
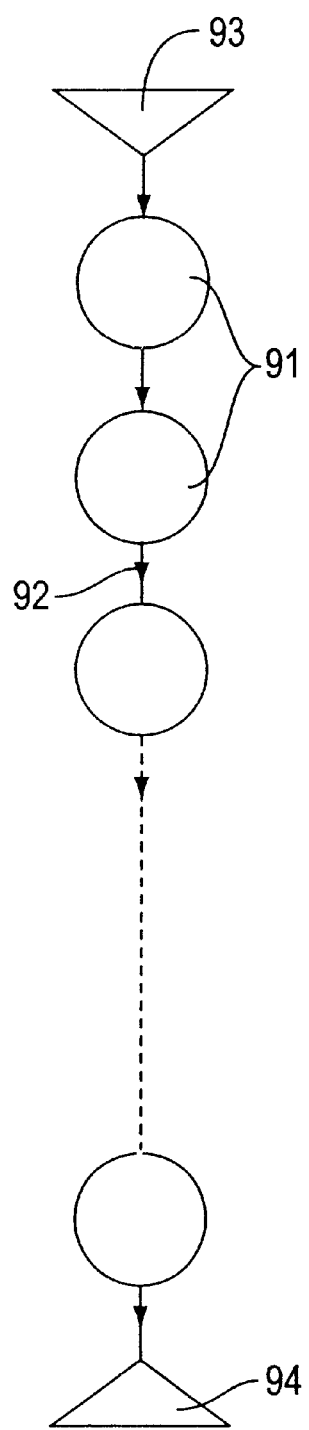
FIG. 5 schematically depicts a series of crystallization chambers that are connected to each other by small diameter tubing, with the first and last crystallization chambers being connected via tubing to source and drain reservoirs (e.g., syringes), respectively.

FIG. 5 schematically depicts a series of crystallization chambers 91 that are connected to each other by small diameter tubing 92, with the first and last crystallization chambers being connected via tubing to a source reservoir 93 and a drain reservoir 94 containing reagent solutions of selected concentration. The source and drain reservoirs referred to in FIG. 5 correspond to, and serve the same function as, respectively, syringes 16 and 18 in FIG. 1. In one embodiment, all of the crystallization chambers in the series initially contain identical reactant and reagent solutions. As each drop of solution is injected from the source syringe into the first cell in the series, an equivalent volume of solution is transferred from each cell into the tubing leading "downstream" to the next adjacent cell in the series, and from the last cell to the drain syringe. Each drop of reagent solution containing a high concentration of precipitant that is injected from the source syringe mixes with the reagent solution in the first cell, and is diluted so that the reagent solution that is transferred from the first cell to the second cell has a lower concentration of precipitant than the drop which was injected into the first cell. The dilution of transferred reagent solution occurs in each subsequent cell in the series in like manner. Accordingly, the rate at which the concentration of precipitant increases is greatest in the crystallization chamber adjacent to the source reservoir, and is successively lower in each successive chamber in the series. To have full control of the precipitant concentrations in the cells, it is important that the reagent solutions do not flow or diffuse between cells except during controlled transfers. To prevent "crossflow," very small diameter tubing is used to connect the cells. Alternatively, valves can be inserted in the lines of tubing 92 between the cells which are only opened during the times when liquid is being transferred between cells.

Figure 6:
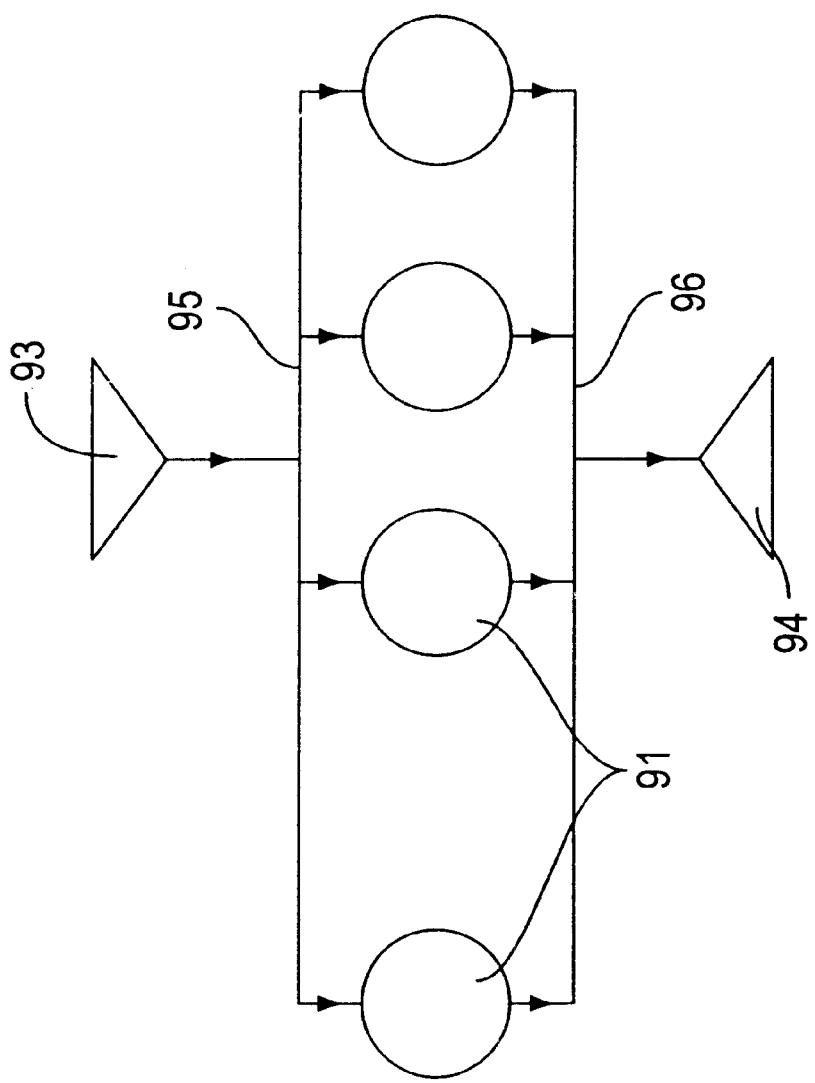
FIG. 6 schematically depicts a row of crystallization chambers connected via manifolds to source and drain reservoirs.

FIG. 6 schematically depicts an embodiment of the invention in which reagent solution is transferred from a source reservoir 93 via a manifold 95 to multiple crystallization cells 91, each of which can vary in its initial reactant and/or reagent solutions, and from the crystallization cells 91 via manifold 96 to a drain reservoir 94. With this embodiment, crystallization processes can be monitored in a set of crystallization chambers having different initial conditions as the concentration of one or more precipitants is varied simultaneously in all of the cells in a coordinate manner.

Figure 7:
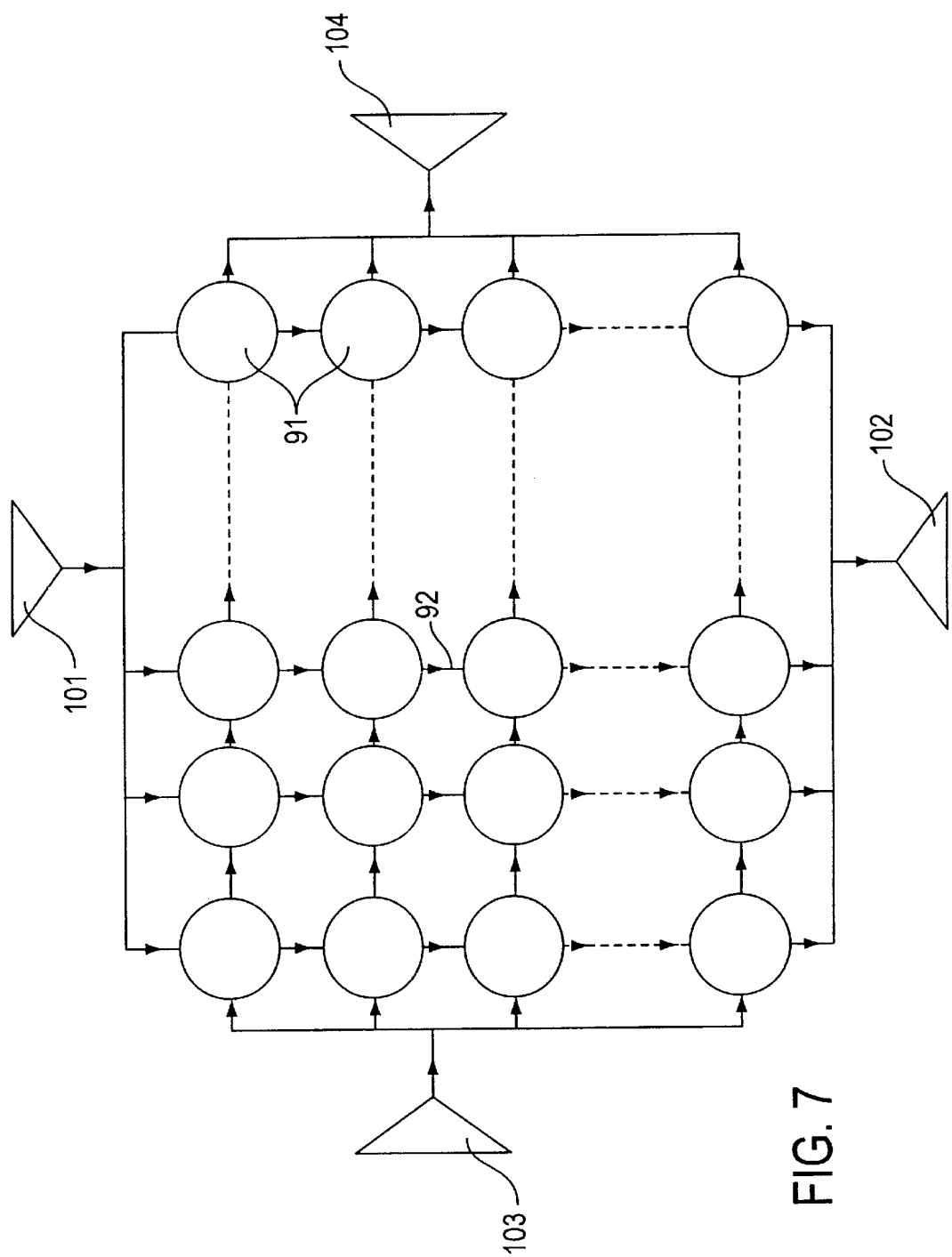
FIG. 7 schematically depicts a 2-D matrix of crystallization chambers, with the crystallization chambers of the rows being connected via manifolds to one pair of source and drain reservoirs, and the crystallization chambers of the columns being connected via manifolds to a different pair of source and drain reservoirs.

The present invention also includes configuring crystallization chambers in two- and three-dimensional matrices according to the teachings described above, in order to analyze crystallization under a large number of different, dynamically controlled conditions. FIG. 7 schematically depicts a 2-D matrix of crystallization chambers 91 through which two different solutions, each containing one or more precipitants, are pumped in different directions to produce independently controlled concentration gradients of the precipitants across the rows and columns of cells. Paired source and drain syringes are operated in tandem, and the different source/drain pairs 101/102 and 103/104, respectively, are operated sequentially. Cross-flow between cells is prevented by using small bore tubing to connect the cells, and if necessary, valves in the lines between the cells which only open when fluid is being transferred.

In like manner, the effects on crystallization of varying the concentration of one or more additional precipitants in multiple crystallization chambers can be observed by connecting the crystallization chambers of two or more matrices, e.g., in a "stack," to form a third dimension across which one or more gradients of precipitant concentration is established. The paired source and drain syringes controlling flow of the additional reagent solutions into crystallization chambers of the first matrix, and out of chambers of the last matrix, are operated in tandem, and are operated sequentially with respect to the other pairs of syringes, in the manner described above for paired syringes in the 2-D matrix. Of course, there are innumerable variations and combinations of the configurations of the invention described above which can also be employed to analyze crystallization, e.g., by using multiple, independently controlled source syringes connected to the same or different cells in a given dimension, and by varying the initial conditions in the crystallization chambers. Such variations of the method and apparatus described herein are easily within the ability of those skilled in the art of producing molecular crystals, and are also included in the present invention.

In addition to controlling the concentration of one or more chemical precipitants to produce molecular crystals, the methods of the present invention permit and include controlling the physical parameters that can influence or promote crystal growth, or improve the quality of the crystals that are grown. For example, temperature is an important physical parameter affecting crystal growth, and the present invention includes use of a device to control temperature of the solutions in the crystallization chamber. Examples of a device for controlling the crystallization temperature include a Peltier cooler, a temperature controlled container, and heating coils imbedded in the system.

As discussed above, another important physical parameter influencing crystal growth is gravity. Crystallization experiments that have been conducted in space indicate that larger and more homogenous crystals can be grown in microgravity (1/1000 g to 1/10,000 g) environments by eliminating the effects of the earth's gravitational field. Example 2 below describes the successful operation of the present invention in producing protein crystals in the microgravity environment of space. The apparatus of the present invention can be spun by a centrifuge in space to subject the reactant molecules in the crystallization chamber to gravitational forces that are greater than the microgravity present in space, but less that normal earth gravity. Alternatively, a centrifuge can be used in space or on earth to subject the reactant molecules in the crystallization chamber to a gravitational force that is greater than normal earth gravity.

The advantages obtained by growing crystals in reduced gravity in space can also be obtained by growing crystals in reduced effective gravitational fields such as those resulting from diamagnetic effects induced in a very high magnetic field. In a strong magnetic field, diamagnetism causes the electrons of molecules in the field to experience a force of repulsion or attraction that is dependent on the strength of the magnet and the distance of the molecules from the center of the magnet. In a sufficiently strong magnetic field, there is a position with respect to the center of the magnet at which matter will experience zero effective gravitational force ($g_{eff}=0$), and the matter will levitate (Beaugnon et al., Nature (1991) 349:470). When moved to different positions with respect to the center of the magnet, the matter experiences effective gravitational forces that range between zero and normal earth gravity. At other positions with respect to the magnet's center, and depending on the strength of the magnetic field, the matter experiences effective gravitational forces ranging from one to twenty times the gravity at earth's surface. The same real-time, remote-controlled operative capabilities, compactness, and ease of use that permit the apparatus and method of the present invention to be used in microgravity environments of space also permit the present invention to be used efficiently in the restricted environments in which very high magnetic fields are produced to grow crystals in effective gravitational fields ranging from zero to about twenty times the gravity at earth's surface. An added benefit obtained by growing crystals in a magnetic field capable of generating strong diamagnetic forces is that the molecules in such a field tend to be aligned in the same direction, which promotes the growth of ordered crystals.

Figure 8:
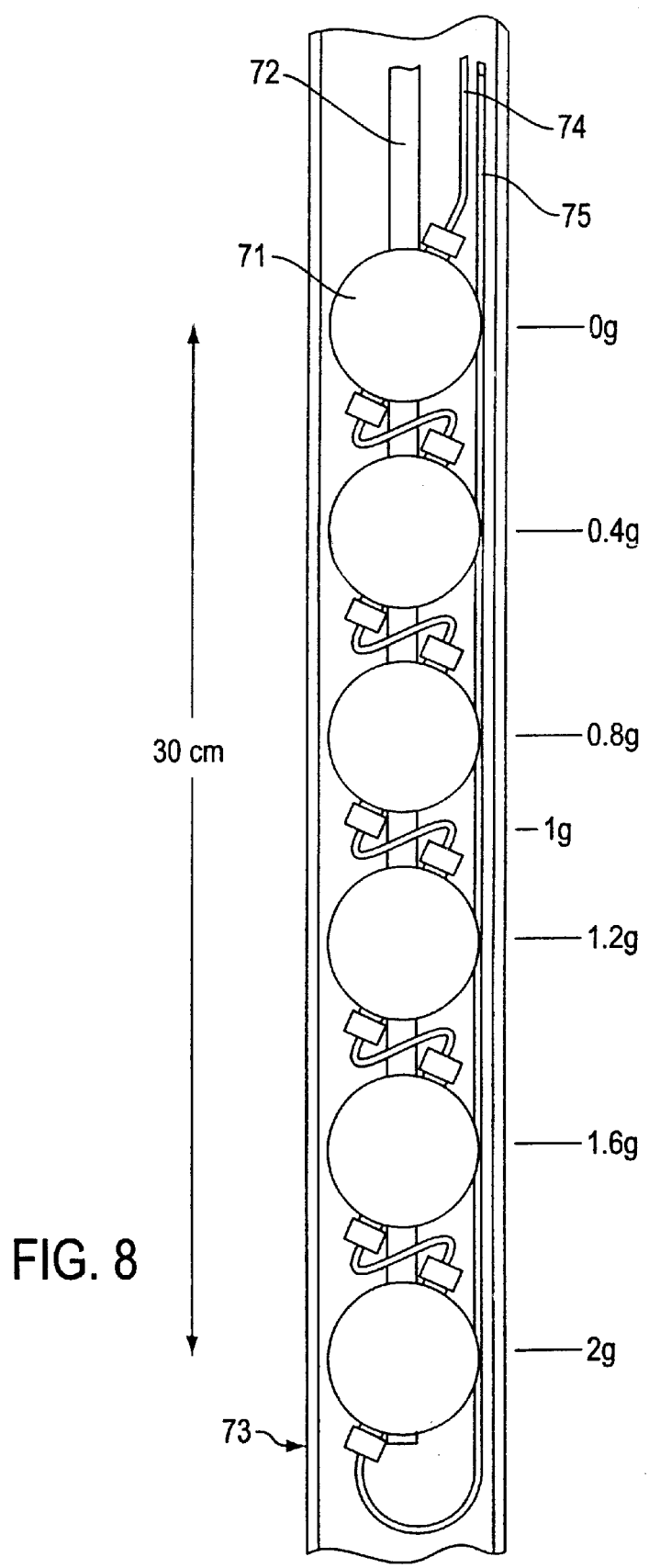
FIG. 8 schematically depicts a series of crystallization chambers in the bore of a magnet capable of generating effective gravitational fields of from between 0 to 2 times the gravity at earth's surface.

To grow crystals under a range of different effective gravitational forces, a vertical assembly of crystallization chambers 71 supported by support strip 72 is placed in the bore 73 of a high field magnet (e.g., 16 T), as shown in FIG. 8. Each crystallization chamber 71 consists of a reactant reservoir of about 1 ml volume which communicates with the reagent chamber (a few mm³ volume) through a dialysis membrane, as described previously. Hence, each crystallization chamber is at a different $g_{eff}$ value, and also a different magnetic field value. For a given magnetic field value, the crystallization chamber can be positioned for the $g_{eff}=0$ condition by adjusting the entire stack. It is important to note that the stack does not levitate. Rather, it is the reactant crystallites in the specific cell where $g_{eff}=0$ which will experience no net force over a distance of less than 1 mm. Each chamber in the stack samples a gradual variation of $g_{eff}$ with position as shown in FIG. 8. Those chambers above magnet center are at $g_{eff}<g$, whereas those below are at $g_{eff}>g$. The chamber in the center represents the control experiment where the magnetic field is present, but $g_{eff}=g$. The first crystallization chamber 71 shown in FIG. 8 is connected to a reagent solution source reservoir by inlet tube 74. Small-diameter tubing connects each of the crystallization chambers to the next one in the series, and the last chamber in the series is connected to a drain reservoirs by return tube 75. This configuration of crystallization chambers is similar to that shown in FIG. 5. By controlling the flow of reagent solution containing one or more precipitants through the series, a concentration gradient of precipitant can be established across the series of crystallization chambers. By this means, it is possible to grow crystals in a multifactorial environment in which both precipitant concentration and effective gravitational field are varied. Moreover, the total magnetic field is also variable; it can be varied anywhere from about 16 to 33 Tesla. This shifts the $g_{eff}=(2 \text{ to } 6)$ g and the $g_{eff}=0$ points farther away from the center of the magnet. For fields less than 16 T, the $g_{eff}=0$ condition cannot be maintained, but a finer variation for the condition 2 g $<g_{eff}<g$ can be obtained.

In one embodiment of the invention, the magnet is a water-cooled resistive magnet, and the controller can adjust the temperature of the magnetic bore to temperatures between 10 and 40° C. once it reaches a steady state, to give control over an additional physical parameter affecting crystal growth. In a different embodiment, the magnet is a superconducting magnet that is kept cold in a cryogenic container, similar to the magnets used by nuclear magnetic resonance (NMR) spectroscopists or clinical magnetic resonance imaging (MRI) specialists, for which access to the magnetic field region of interest is at a temperature selected by the controller; e.g., room temperature.

EXAMPLES

Crystals of carboxy peptidase-A (CPA) and concanavalin-A (CON-A) were produced under normal earth gravitational conditions (1 g) using the methods and apparatus of the present invention. Using the present invention, crystals of Ribonuclease S were grown both on earth at 1 g, and in the microgravity environment on board the Space Shuttle (Flight STS-95). The crystallization chamber in the apparatus used for the experiments has a volume of 1 ml.

Example 1

Crystallization of CPA

In the experiments with CPA, the protein was disposed in a dialysis bag in 50 microliters of solution of 1.2M LiCl at a pH of 7.5 at a protein concentration of 12 mg/ml. The dialysis bag was then placed in the crystallization chamber and the remainder of the crystallization chamber was filled with a 1.2M solution of LiCl at pH of 7.5. One of the syringes was loaded with a 0.1M solution of LiCl at pH of 7.5 which was injected into the crystallization chamber. Several trials were conducted under these initial conditions with the amount of salt solution transferred from the syringe to the crystallization chamber being different in each trial. In each trial, the amount of salt solution transferred from the crystallization chamber was equal to the amount of salt solution transferred to the crystallization chamber, as described above. Each of the mixing times was under 1 minute.

The results of the crystallization tests for CPA are presented below in Table 1.

TABLE 1

| Trial # | initial CC solution | ml. of .1M LiCL/7.5 injected | Results |
|---|---|---|---|
| 1 | 1.2M LiCl/7.5 | 3 ml. | No crystals |
| 2 | 1.2M LiCl/7.5 | 4 ml. | No crystals |
| 3 | 1.2M LiCl/7.5 | 5 ml. | Large crystals |
| 4 | 1.2M LiCl/7.5 | 6 ml. | Large crystals |
| 5 | 1.2M LiCl/7.5 | 6.5 ml. | Large crystals |

It can be seen that trials 1 and 2 did not lower the concentration of the salt solution in the crystallization chamber enough to produce large crystals. However, in trials 3–5 larger amounts of low concentration salt solution were transferred into the crystallization chamber and thus the concentration of salt solution was lowered into a range in which the protein can come out of solution to form large crystals. The results of trials 3–5 compared favorably to a control trial using a conventional dialysis method of crystallization. In the control trial a 50 μl dialysis bag was filled with CPA at a concentration of 12 mg/ml in 1.2M LiCl at a pH of 7.5. The dialysis bag was then suspended in 1 ml of 0.1M LiCl at a pH of 7.5. While the control trial yielded large crystals it could not be dynamically or remotely controlled because once the dialysis bag was placed in the salt solution, crystallization conditions could not be altered.

Example 2

Crystallization of Ribonuclease in Space

Ribonuclease S protein was purchased from Sigma chemical company. The protein was dissolved to a concentration of 24 mg/ml in a solution of 25% ammonium sulfate, 25% sodium chloride, 0.1 M Na-acetate, pH 5.0, and was dialyzed against the same solution overnight. At this concentration, protein crystallization begins at about 75% total salt saturation of the precipitant solution. This level was reached at a gradual rate through dialysis in the Dynamically Controlled Crystallization System (DCCS) of the present invention, and through vapor diffusion in hanging drops. All solutions included a standard 25% saturated ammonium sulfate and 0.1 M Na-acetate, pH 5.0. In all cases, the only precipitant that was varied was sodium chloride. Crystallization generally occurs when the concentration of NaCl reaches 47–52% saturation. The preliminary hanging drop trials were carried out in linbro plates from Hampton research. The reservoirs were filled with solution containing precipitant at concentrations expected to give precipitation. They were made by mixing 250 microliters of saturated ammonium sulfate, 40 microliters 2.5 M Na-acetate, 470–600 microliters of saturated NaCl, and water to 1 ml volume. The amounts of NaCl were selected to scan a broad range, to find the value that gave the best crystals. The hanging drops were formed by mixing equal 5-microliter volumes of protein solution and reservoir solution on a siliconized coverslide, also from Hampton Research. The drops were kept at room temperature (24° C.). The process of vapor diffusion in a sealed system gradually increased the salt concentration in the drop to the level in the reservoir, and nucleation occurred. Other trials were performed using the DCCS of the present invention. In the method used in this example, the source syringe was filled with the precipitant solution at the expected level of crystallization. The reservoir was filled with a lower level of a similar solution. It would include the standard ingredients and only 35–40% sodium chloride. This concentration is too low to nucleate Ribonuclease S crystals. These units were also kept at room temperature throughout the trials. As the motor pushed the source syringe plunger, the syringe was emptied into the reagent reservoir of the crystallization chamber and gradually increased the precipitant concentration in that reservoir to that of the source syringe solution. The precipitant in the reagent solution in the crystallization chamber then diffused across the dialysis membrane into the reactant chamber until the precipitant concentration therein reached the precipitant concentration of the reagent solution, and nucleation occurred.

Both methods produced similar crystals and were reproducible, as expected. At a sodium chloride concentration of about 53% saturation a few small crystals would appear overnight. They tended to be about 0.1 mm in size and usually did not have a standard crystal shape. The edges were not straight, probably because the growth was too fast. When nucleation occurs too rapidly, the result is too many crystals of insufficient size with sub-standard morphology. A better precipitant concentration is around 47–50% sodium chloride. At these levels, nucleation yields about 1–5 crystals, some of which grow to over 1 mm, which is ideal. The DCCS units yield a few more crystals because the volume of the protein chamber is much greater than that of a hanging drop. The 50 ul chambers in the units contain 1.2 mg of protein whereas the 10 ul hanging drops only contain 0.12 mg of RNase S protein. Space experiment setups:

For the final DCCS preparation for the STS-95 mission of space shuttle Discovery, the loading was similar to that in laboratory trials. Four DCCS units were loaded for the SpaceHab payload bay module and six were loaded to remain on the ground in the SpaceHab facility, Cape Canaveral, Fla. Four of the six ground units were the positive controls and were placed into a 24° C. Incubator. The other two units were brought as spare units and were placed outside of the incubator on the lab bench. They were also kept at approximately 24° C. The conditions in the source syringes for the flight units were 47% sodium chloride in unit F00, 50% in F01, 53% in F02, 53% in F03 and the starting reservoirs were filled with 35% sodium chloride. The six ground units were loaded as follows: 47% sodium chloride in G00, 47% in G04, 50% in G01, and 53% in G02 in the incubator, and 50% in G03 and 53% in the two outside the incubator. The reservoirs were initially filled with 35%. The mission length of STS-95 was 10 days. The computer program ran and syringes moved for the first 3.5 days of the mission. Accordingly, the solution containing the protein would take 3.5 days to reach the expected nucleation point, and the remainder of the time the crystals could continue to grow.

Harvesting, Photography, Analysis of Crystals and Mounting

After the mission, the DCCS units were then shipped from Florida to the Center for Advanced Research in Biotechnology (CARB) in Gaithersburg, Md., and opened there. The crystals were counted through the membrane using a microscope. The crystals were first photographed with a Nikon FX camera through the dialysis membrane, while remaining in their growth environment. This allows comparison of where in the chamber they grew and their appearance before being moved in the event damage occurs during that process. Next, the procedure involved removing them from the original protein chamber and placing them in artificial mother liquor in hanging drops. The mother liquor solution consisted of 60% sodium chloride, 24% ammonium sulfate and 1 M sodium acetate. Crystals that were free floating in the growth chamber were simply inverted onto a coverslide and poured out of the chamber. However, those that had grown stuck to the various walls of the chamber and to the membrane had to be gently detached from the surface with a fiberloop and physically placed into hanging drops. At his point the crystal sizes were measured using a microscope. Morphology and defect observations were also made and documented. Photographs were then taken again while in this hanging drop environment with the same camera and later transferred into digital image files. Once well documented on film and stabilized in solution, the crystals were mounted in 1.0 mm, siliconized glass capillaries for X-ray diffraction analysis.

Results

Upon landing of the STS-95, ribonuclease crystals were seen in all DCCS units except the two spares which did not produce any crystals. Observations made while crystals remained in the protein chambers showed little difference in the two growth environments. Approximately the same number of crystals were present in each of the corresponding ground and space units, as expected. The amount of crystals recovered in both environments followed the expected curve. (See Table 2.) The higher the precipitant concentration the more nucleation and the smaller the crystals. Crystals grown in space were approximately equal in size to their ground-grown counterparts. The crystal yields (fraction of protein that was actually incorporated into crystals) were roughly similar. The major difference in the two was found when harvest time came. As usual, a common problem arose in the ground units; the crystals grown on the ground adhered to the walls and membrane of the chamber and were difficult to remove without damage. Throughout all four ground units about 80% of the crystals were stuck and, in particular, the biggest and best were the most difficult to harvest. The crystals that were grown in microgravity were about 80% loose and free-floating in their growth solution. These crystals "poured" out onto coverslides with little or no handling necessary.

TABLE 2

Overview of DCCS Individual Unit Results.

| Unit | Location of Growth | % NaCl Concentration | Number of Crystals | Avg. Size mm | Largest Size mm | % Yield |
|---|---|---|---|---|---|---|
| F00 | Space | 47 | 3 | 1.2 | 1.6 | 8 |
| F01 | Space | 50 | 6 | 1.15 | 1.3 | 14 |
| F02 | Space | 53 | 35 | 0.6 | 0.7 | 11 |
| F03 | Space | 53 | 30 | 0.55 | 0.7 | 7 |
| G00 | Incubator | 47 | 1 | 1.5 | 1.5 | 5 |
| G01 | Incubator | 50 | 4 | 1.2 | 1.4 | 10 |
| G02 | Incubator | 53 | 40 | 0.55 | 0.6 | 10 |
| G03 | Bench | 53 | 0 | 0 | 0 | 0 |
| G04 | Incubator | 47 | 1 | 1.4 | 1.4 | 4 |
| G05 | Bench | 50 | 0 | 0 | 0 | 0 |

Although the crystals from earth and space were generally similar in appearance there were some differences. Crystals from both environments typically had six well-developed faces, with the two tips slightly rounded. Because the ground crystals were more often stuck to the wall, they tended to have less complete, perfect shapes. Conversely, because the space crystals were unattached and free to tumble around, they had more uniform overall shape. However, due to the tumbling the space crystals occasionally had minor damage to edges and tips, but not enough to significantly interfere with their analysis.

The computer program ran to completion, as expected. All source syringes came back empty and the drain syringes were full.

Discussion

The mission was a success having all the initial goals met. Large crystals were obtained from both space and ground experiments. Topography analysis requires crystals that are at least 0.5 mm, and several crystals of this size from both environments and various precipitant conditions were recovered. The size and number of RNase S crystals followed what was seen in the preliminary experiments with the size and number increasing with increasing salt concentration and decreasing in size (See Table 2.).

The primary difference observed was that crystals adhered to the walls of the protein chamber in the ground units, while the majority of the crystals grown in microgravity were loose crystals. The size and quality of the crystals does not matter if they cannot be harvested from their growth environment. The earth-grown crystals grew about as well as the space grown, and this is captured on film. However, damage done during harvesting caused them to be lesser in quality for purposes of analysis. Cracks often occurred and fragmented corners were a common problem when breaking them free of the surfaces on which they grew.

All publications, patents, and patent applications mentioned in the above specification are incorporated herein by reference. Nothing herein is to be construed as an admission that the invention is not entitled to antedate such disclosure by virtue of prior invention. Various modifications and variations of the described methods and system of the invention will be apparent to those skilled in the art without departing from the scope and spirit of the invention. Although the invention has been described in connection with specific embodiments, it should be understood that the invention as claimed is not limited to such specific embodiments, and that various modifications of the described modes for carrying out the invention which are obvious to those skilled in the arts to which this invention pertains are intended to be within the scope of the following claims.

We claim:

1. An apparatus for crystallizing molecules comprising:
    at least one crystallization chamber configured to contain a reactant solution comprising a molecule to be crystallized and a reagent solution comprising at least one precipitant, which solutions are in contact with, and separated by, one of a permeable membrane and a permanent sieve comprising pores that are large enough to permit passage of said at least one precipitant, but not large enough to permit passage of the molecules to be crystallized, from one solution to the other;
    at least one first reagent solution reservoir and at least one second reagent solution reservoir, said first and second reagent solution reservoirs being configured to contain respective reagent solutions comprising said at least one precipitant;
    at least one first communicating means for communicating said first reagent solution reservoir with the reagent solution in said crystallization chamber;
    at least one second communicating means for communicating said second reagent solution reservoir with the reagent solution in said crystallization chamber;
    at least one first transfer means for selectively transferring solution between said first reagent solution reservoir and the reagent solution in said crystallization chamber;
    at least one second transfer means for selectively transferring solution between said second reagent solution reservoir and the reagent solution in said crystallization chamber; and
    interlocking means for interlocking said first transfer means and said second transfer means to cause said first transfer means and said second transfer means to reversibly transfer equal volumes of reagent solution into and out of said crystallization chamber.

2. An apparatus as recited in claim 1, further comprising dynamic control means coupled to said first transfer means and said second transfer means for controlling the amounts of reagent solutions transferred by said first transfer means and said second transfer means.

3. An apparatus as recited in claim 1, wherein said first reagent solution reservoir and said first transfer means comprise a first syringe, and said second reagent solution reservoir and said second transfer means comprise a second syringe.

4. An apparatus as recited in claim 3, further comprising a motor operatively coupled to said first syringe and said second syringe, said motor being a part of said first transfer means and said second transfer means.

5. An apparatus as recited in claim 4, wherein said interlocking means comprises a yoke operatively coupled between said motor and said first syringe and said second syringe,
    wherein said first transfer means and said second transfer means act in opposition to one another so that when said first transfer means transfers a volume of solution from said first reagent solution reservoir to said reagent solution in said crystallization chamber, said second transfer means transfers an equal volume of solution from said reagent solution in said crystallization chamber to said second reagent solution reservoir,
    and vice versa.

6. An apparatus as recited in claim 5, further comprising a guide rod, said yoke being mounted on said guide rod, and further being disposed to slide on said guide rod.

7. An apparatus as recited in claim 6, wherein said first and second transfer means further comprise a lead screw coupled to a shaft of said motor, said lead screw being engaged with said yoke via a threaded bushing.

8. An apparatus as recited in claim 4, wherein said control means is operatively coupled to said motor to control transfer of the reagent solution.

9. An apparatus as recited in claim 1, wherein said crystallization chamber comprises a container in which a dialysis membrane is interposed between the reagent solution and the reactant solution.

10. An apparatus as recited in claim 1, further comprising means for measuring parameters of the reagent solution in said crystallization chamber selected from at least one of conductivity, pH, and temperature.

11. An apparatus as recited in claim 1, further comprising means for monitoring at least one of crystal nucleation and growth in the reactant solution in said crystallization chamber.

12. An apparatus as recited in claim 1, further comprising means for dynamically controlling, in real time, parameters of the reagent solution in said crystallization chamber selected from at least one of conductivity, pH, and temperature, and effective gravity.

13. An apparatus as recited in claim 1, further comprising means for selectively starting and stopping a crystallization process in said crystallization chamber.

14. An apparatus as recited in claim 1, comprising two or more crystallization chambers connected in series via solution communicating means; wherein said first reagent solution reservoir is connected via solution communicating means to the crystallization chamber at one end of the series, and said second reagent solution reservoir is connected via solution communicating means to the crystallization chamber at the other end of the series.

15. An apparatus as recited in claim 1, comprising two or more crystallization chambers, each of which is connected via solution communicating means to said at least one first reagent solution reservoir.

16. An apparatus as recited in claim 1, further comprising at least one additional pair of reagent solution reservoirs that are respectively connected by solution communicating means to the reagent solution in said at least one crystallization chamber, wherein the initial concentration of said at least one precipitant in the reagent solutions in said at least one additional pair of reagent solution reservoirs is not the same as the initial concentration of said at least one precipitant in said first and second reagent solution reservoirs;

and further comprising additional solution transfer means and interlocking means for selectively transferring reagent solutions between said at least one additional pair of reagent solution reservoirs and said reagent solution in said at least one crystallization chamber, wherein said solution transfer means for operating each of said pairs of reagent solution reservoirs, including said first and second reagent solution reservoirs, operate sequentially with respect to each other.

17. An apparatus for crystallizing molecules comprising:

at least one crystallization chamber configured to contain a reactant solution comprising a molecule to be crystallized and a reagent solution comprising at least one precipitant, which solutions are in contact with, and separated by, one of a permeable membrane and a permanent sieve comprising pores that are large enough to permit passage of said at least one precipitant, but not large enough to permit passage of the molecules to be crystallized, from one solution to the other;

at least one first reagent solution reservoir and one second reagent solution reservoir, said first and second reagent solution reservoirs being configured to contain respective reagent solutions comprising said at least one precipitant;

at least one first conduit coupling said first reagent solution reservoir with said reagent solution in said crystallization chamber;

at least one second conduit coupling said second reagent solution reservoir with said reagent solution in said crystallization chamber;

at least one first transfer mechanism configured to selectively transfer solution between said first reagent solution reservoir and said reagent solution in said crystallization chamber;

at least one second transfer mechanism configured to selectively transfer solution between said second reagent solution reservoir and said reagent solution in said crystallization chamber; and an interlock coupling said first transfer mechanism and said second transfer mechanism to cause said first transfer mechanism and said second transfer mechanism to reversibly transfer equal volumes of reagent solution into and out of said crystallization chamber.

18. The apparatus according to claim 1, further comprising:

a support strip, said at least one crystallization chamber comprising a plurality of crystallization chambers mounted in a vertical assembly on said support strip; and a magnet having a bore defined through a center of the magnet, said support strip being adjustably positioned in the bore, whereby a net force acting on the crystallization chambers simulates crystallization in a microgravity environment.

19. The apparatus according to claim 18, wherein said magnet is a water-cooled resistive magnet.

20. The apparatus according to claim 18, wherein said magnet is a superconductor magnet.

\* \* \* \* \*